(12) United States Patent
Steckel et al.

(10) Patent No.: US 9,620,686 B2
(45) Date of Patent: Apr. 11, 2017

(54) DISPLAY LIGHT SOURCES WITH QUANTUM DOTS

(71) Applicant: Apple Inc., Cupertino, CA (US)

(72) Inventors: Jonathan S. Steckel, Cupertino, CA (US); Sajjad A. Khan, Cupertino, CA (US); Jean-Jacques P. Drolet, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/853,580

(22) Filed: Sep. 14, 2015

(65) Prior Publication Data
US 2016/0218252 A1 Jul. 28, 2016

Related U.S. Application Data

(60) Provisional application No. 62/108,961, filed on Jan. 28, 2015.

(51) Int. Cl.
*H01L 29/18* (2006.01)
*H01L 29/15* (2006.01)
*H01L 29/20* (2006.01)
*H01L 31/0232* (2014.01)
(Continued)

(52) U.S. Cl.
CPC ............ *H01L 33/501* (2013.01); *H01L 33/56* (2013.01); *H01L 2224/1403* (2013.01); *H01L 2224/16225* (2013.01); *H01L 2924/0002* (2013.01); *H01L 2924/181* (2013.01)

(58) Field of Classification Search
CPC ....... H01L 33/502; H01L 33/58; H01L 33/60; H01L 33/501; H01L 33/56; H01L 2224/1403; H01L 2224/16225; H01L 2924/181

USPC ................ 257/76, 88, 432, E33.06, 89, 103, 257/E51.022, E33.062; 438/28
See application file for complete search history.

(56) References Cited

U.S. PATENT DOCUMENTS 6,803,719 B1 * 10/2004 Miller .................... B82Y 10/00
257/100
8,174,034 B2 5/2012 Bogner et al.
8,330,348 B2 12/2012 Berben et al.
(Continued)

OTHER PUBLICATIONS

David Mocatta et al., "Heavily Doped Semiconductor Nanocrystal Quantum Dots", Science, Apr. 1, 2011, p. 77-81, vol. 332.
(Continued)

*Primary Examiner* — Dzung Tran
(74) *Attorney, Agent, or Firm* — Treyz Law Group, P.C.; G. Victor Treyz; Joseph F. Guihan

(57) ABSTRACT

A display may be provided with light sources. The light sources may include light-emitting diodes. The light sources may have packages formed from package bodies to which the light-emitting diodes are mounted. Layers such as quantum dot layers, light-scattering layers, spacer layers, and diffusion barrier layers may be formed over the package bodies and light-emitting diodes. Quantum dots of different colors may be stacked on top of each other. A getter may be incorporated into one or more of the layers to getter oxygen and water. Quantum dots may be formed from semiconductor layers that are doped with n-type and p-type dopant to adjust the locations of their conduction and valance bands and thereby enhanced quantum dot performance.

20 Claims, 14 Drawing Sheets

(51) Int. Cl.
*H01L 33/50* (2010.01)
*H01L 33/56* (2010.01)

(56) References Cited

U.S. PATENT DOCUMENTS

| | | |
|---|---|---|
| 2006/0145599 A1 | 7/2006 | Stegamat et al. |
| 2007/0176539 A1* | 8/2007 | Mathai .............. H01L 27/3239 313/504 |
| 2007/0194694 A1* | 8/2007 | Reddy ................ B82Y 20/00 313/503 |
| 2007/0221947 A1* | 9/2007 | Locascio ............ B82Y 30/00 257/103 |
| 2008/0061687 A1* | 3/2008 | Cok .................. H01L 51/5268 313/506 |
| 2010/0084674 A1* | 4/2010 | Paetzold ............. B82Y 20/00 257/98 |
| 2010/0283036 A1* | 11/2010 | Coe-Sullivan ....... H05B 33/145 257/13 |
| 2012/0236587 A1 | 9/2012 | Kim et al. |
| 2015/0187987 A1* | 7/2015 | Sim ................. G02F 1/133602 257/98 |
| 2015/0340564 A1* | 11/2015 | Hikmet ............... G02B 1/04 257/98 |

OTHER PUBLICATIONS

Christopher Tuinenga et al., "In Situ Observation of Heterogeneous Growth of CdSe Quantum Dots: Effect of Indium Doping on the Growth Kinetics", ACSNano, Jun. 20, 2008, p. 1411-1421, vol. 2-No. 7, Published Online.

Renguo Xie et al., "Synthesis of Cu-Doped InP Nanocrystals (d-dots) with ZnSe Diffusion Barrier as Efficient and Color-Tunable NIR Emitters", JACS Articles, Jul. 9, 2009, p. 10645-10651, vol. 131-No. 30, Published Online.

David J. Norris et al., "Doped Nanocrystals", Science, Mar. 28, 2008, p. 1776-1779, vol. 319.

Rahul Thakar et al., "Efficient Emission from Core/(Doped) Shell Nanoparticles: Applications for Chemical Sensing", NANO Letters, Oct. 10, 2007, p. 3429-3432, vol. 7, No. 11, American Chemical Society, Published Online.

Santanu Roy et al., "Progress toward Producing n-Type CdSe Quantum Dots: Tin and Indium Doped CdSe Quantum Dots", J. Phys. Chem., 2009, p. 13008-13015, vol. 113, Published Online.

Andrew W. Wills et al., "Synthesis and characterization of Al- and In-doped CdSe nanocrystals", J. Mater. Chem., 2012, p. 6335-6342, vol. 22.

* cited by examiner

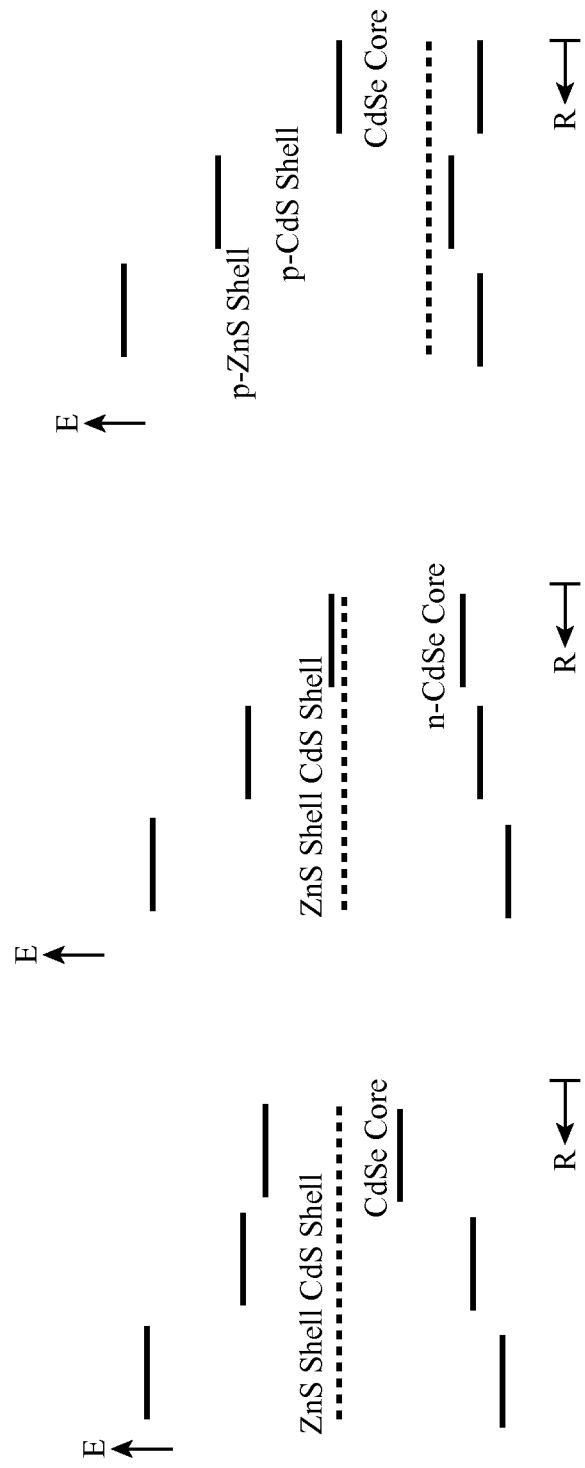

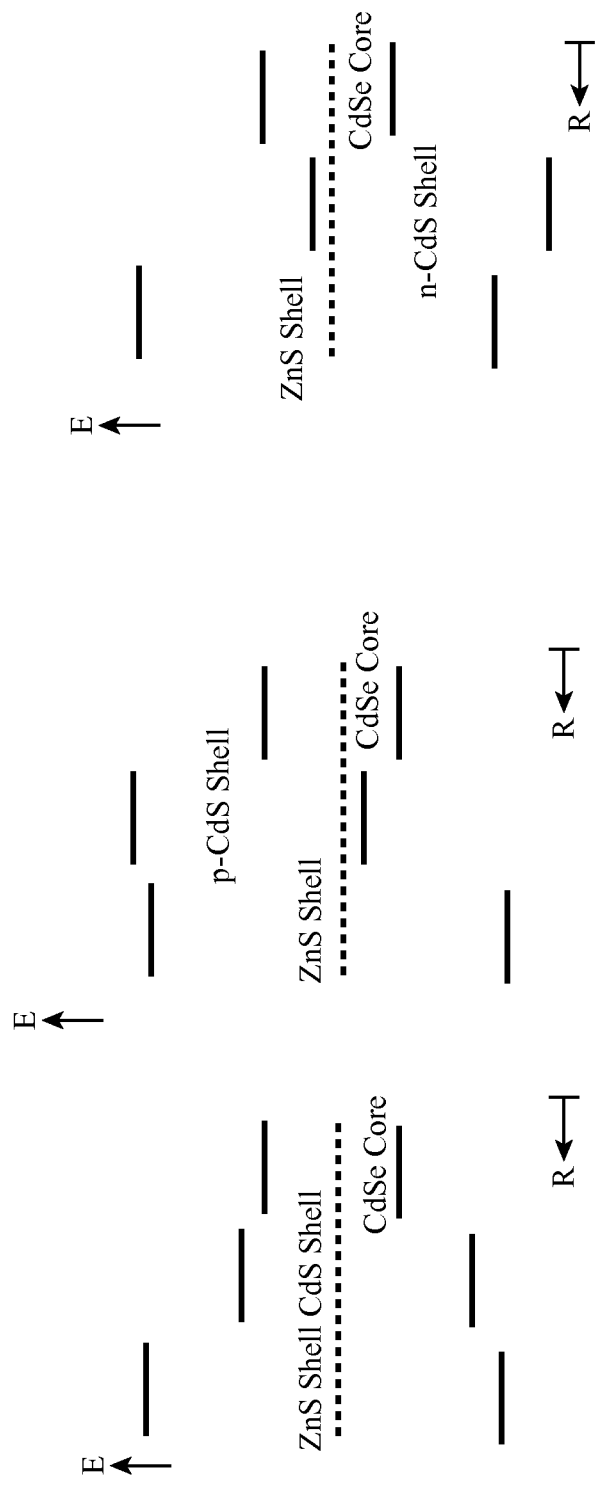

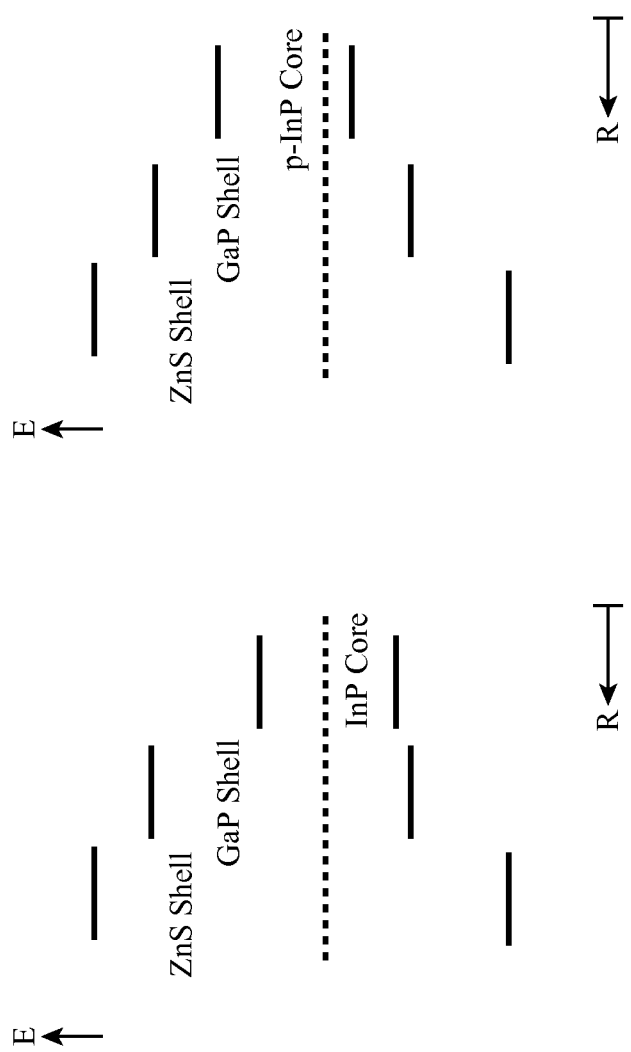

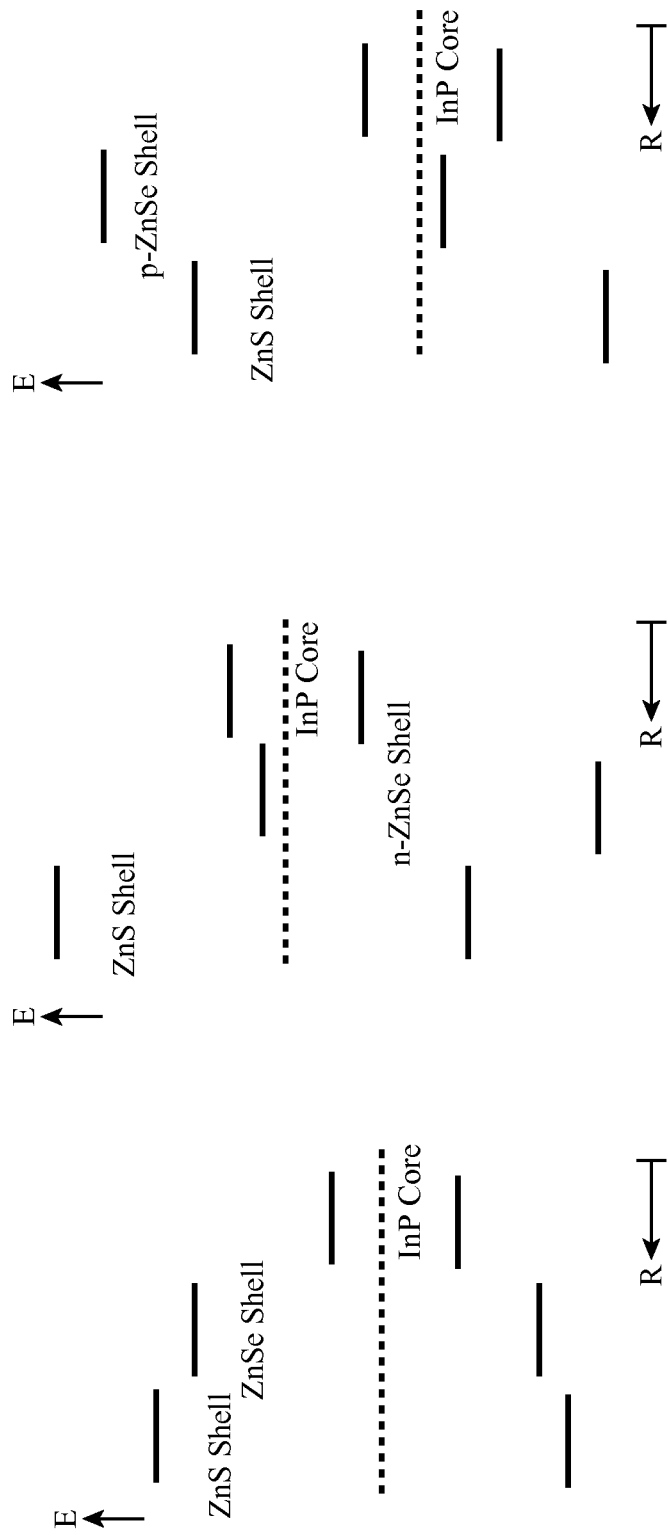

DISPLAY LIGHT SOURCES WITH QUANTUM DOTS

This application claims the benefit of provisional patent application No. 62/108,961 filed on Jan. 28, 2015, which is hereby incorporated by reference herein in its entirety.

BACKGROUND

This relates generally to electronic devices with displays, and, more particularly, to light sources for displays.

Electronic devices such as computers and cellular telephones have displays. Some displays are based on light-emitting diodes. For example, organic light-emitting diode displays have arrays of organic light-emitting diodes. Light-emitting diode displays based on arrays of crystalline light-emitting diode dies have also been developed. Liquid crystal displays have arrays of liquid crystal pixels that are backlit using backlight structures based on light-emitting diodes. These light-emitting diodes may be arranged in an array to support local diming or may be used to edge light a light guide plate in a backlight unit.

Display performance can be enhanced by using narrow linewidth light-emitting diode light sources. For example, color saturation in a display can be enhanced by using light-emitting diode sources that emit narrowband red, green, and blue light. Light sources of this type may exploit the ability of phosphors and quantum dots to produce output light of desired wavelengths and linewidths. For example, a display may include red and green quantum dots to convert some of the blue light from a blue light source to narrowband red and green light.

There are challenges associated with forming this type of display. Quantum dots and phosphors can be sensitive to moisture and oxygen. Quantum dot lifetimes can also be adversely affected by exposure to high pump light intensities and elevated temperatures. Quantum dot performance is also affected by the type of structures used to form the quantum dots. If care is not taken, quantum dots will exhibit insufficient quantum confinement and instability.

It would therefore be desirable to be able to provide enhanced light sources for display.

SUMMARY

A display may be provided with light sources. The light sources may include light-emitting diodes. The light-sources may have packages to which the light-emitting diodes are mounted. The packages may have chip-scale and wire-bond package bodies formed from dielectric. Layers of material may be formed over the light-emitting diodes and packages. These layers may include quantum dot layers, light-scattering layers, spacer layers, and diffusion barrier layers. Quantum dots of different colors may be stacked on top of each other. A getter may be incorporated into one or more of the layers to getter oxygen and water.

Quantum dots may be formed from semiconductor layers that are doped with n-type and p-type dopant to adjust the locations of the conduction and valance bands in the layers of the quantum dots and thereby enhanced quantum dot performance.

BRIEF DESCRIPTION OF THE DRAWINGS

FIGS. 17, 18, 19, 20, 21, 22, 23, 24, 25, 26, 27, 28, and 29 are diagrams illustrating how quantum dot layers may be doped to adjust their conduction and valance bands in accordance with an embodiment.

DETAILED DESCRIPTION

Figure 1:
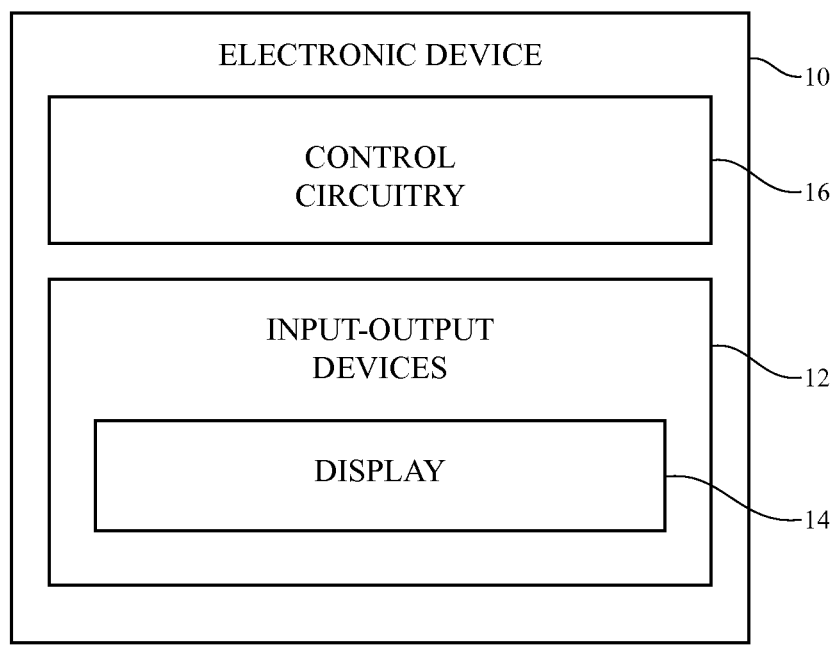
FIG. 1 is a schematic diagram of an illustrative electronic device having a display in accordance with an embodiment.

An illustrative electronic device of the type that may be provided with a display having light sources based on light-emitting diodes is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Device 10 may be a tablet computer, laptop computer, a desktop computer, a television, a cellular telephone, a media player, a wristwatch device or other wearable electronic equipment, or other suitable electronic device.

Display 14 for device 10 includes an array of pixels. The array of pixels may be formed from liquid crystal display (LCD) components, rows and columns of light-emitting diode dies, organic light-emitting diodes, or other suitable display structures. Light-emitting diodes may be arranged in a backlight array (e.g., to form a backlight with local dimming capabilities for a display), may supply light to the edge of a light guide plate in a backlight unit, may be used as individual pixels in an array of pixels that form a display, or may be used to provide light for a display in other display configurations. Display 14 may include a color filter array (e.g., an array having red, green, and blue color filter elements to impart color to display backlight) or other arrangements for providing display 14 with the ability to display color content may be used.

A display cover layer may cover the surface of display 14 or a display layer such as a color filter layer, thin-film transistor layer, or other portion of a display may be used as the outermost (or nearly outermost) layer in display 14. The outermost display layer may be formed from a transparent glass sheet, a clear plastic layer, or other transparent member.

Light sources for display 14 may be based on quantum dot structures. If desired, some or all of the quantum dots in the light sources may be supplemented with or replaced with phosphors (e.g., doped YAG particles). Light sources with quantum dots may sometimes be described as an example. This is, however, merely illustrative. Light sources based on phosphors or mixtures of quantum dots and phosphors may also be used in display 14.

A light-emitting diode such as a blue light-emitting diode may emit pump light (i.e., blue pump light). The quantum dots may be excited by the blue pump light. The quantum dots may include dots of one or more different colors (e.g., red, yellow, green, etc.). When excited by pump light (e.g., blue pump light), red quantum dots will emit red light, yellow quantum dots will emit yellow light, and green quantum dots will emit green light.

Light sources may be formed by packaging quantum dots with light-emitting diodes. The light sources may include one or more different colors of quantum dots. For example, a packaged blue light-emitting diode may include red and green quantum dots. When blue light is produced by the light-emitting diode, the red and green quantum dots will be excited and will emit red and green light, respectively. As a result, the light source will emit blue light (i.e., residual blue light that has not been converted to red and green light by the red and green quantum dots), red light (i.e., red light emitted from the red quantum dots), and green light (i.e., green light emitted from the green quantum dots). The linewidths of the blue, red, and green light emitted by the light source may be relatively narrow, allowing a display that includes this type of light source to exhibit good performance (e.g., good color saturation and efficiency).

Quantum dots may be formed from nanoparticles of semiconductor material. The semiconductor material of the quantum dots may be degraded in the presence of moisture and oxygen. To prevent exposure to moisture and oxygen, diffusion barrier layers (sometimes referred to as moisture barrier layers) may be used to protect the quantum dots.

Figure 2:
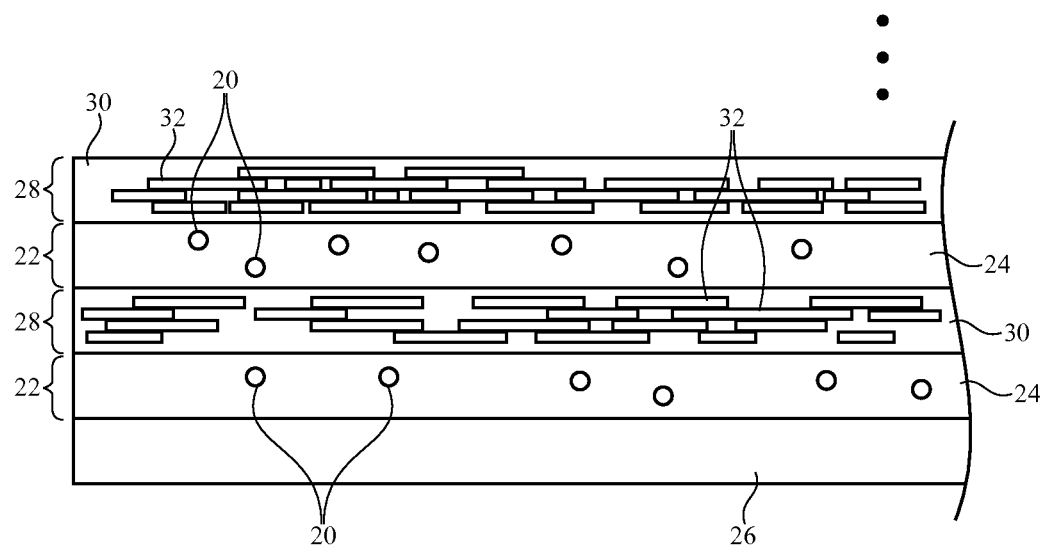
FIG. 2 is a cross-sectional side view of an illustrative diffusion barrier structure for protecting structures such as quantum dots in an electronic device display in accordance with an embodiment.

An illustrative technique that may be used for protecting quantum dots in a light source from moisture and oxygen is shown in FIG. 2. As shown in FIG. 2, quantum dots 20 may be embedded in a supporting matrix such as polymer 24. Polymer 24 may be silicone or other material that is transparent and stable under extended exposure to light and heat. Polymer 24 may be deposited in thin coating layers on a support structure such as support structure 26. Support structure 26 may be a polymer carrier film or other substrate (e.g., an inorganic substrate, an organic substrate, a light-emitting diode die in a packages, quantum dot layers, light scattering layers, other layers in a light source, part of a package, etc.).

Diffusion barrier layers 28 may be interposed between respective quantum dot films 22. One of diffusion barrier layers 28 may also be used to cover the outermost of quantum dot films 22. Each diffusion barrier film may include a supporting matrix such as polymer 30. As with polymer 24 of quantum dot layers 22, polymer 30 of diffusion barrier layers 28 may be silicone or other material that is transparent and stable under extended exposure to heat and light. Inorganic plate-shaped particles 32 may be embedded within polymer 30. Plate-shaped particles 32 may be plate-shaped alumina particles, clay, mica, or other plate shaped particles. The thickness of the plate-shaped particles may be, for example, 10-100 nm, more than 5 nm, less than 200 nm, or other suitable thickness. The diameter of plate-shaped particles 32 may be 10-50 microns, more than 5 microns, less than 100 microns, or any other suitable diameter. With this type of arrangement, the diameter of the plate-shaped particles may be 100-10,000 times greater than the thickness of the plate-shaped particles (as an example).

The thickness of each quantum dot film may be 10-20 microns, less than 25 microns, more than 5 microns, or other suitable thickness. The thickness of barrier films 28 may be less than 40 microns, more than 30 microns, less than 50 microns, or other suitable thickness. The total thickness of layers 22 and 28 may be less than 100 microns (when a compact set of quantum dot layers is desired) or may be larger or smaller than 100 microns.

When the plate-shaped particles are arranged in a thin diffusion barrier layer (e.g., using blade coating, spray coating, or other deposition techniques), the presence of the plate-shaped particles will create a long diffusion path for contaminants such as oxygen and water vapor. Accordingly, each diffusion barrier layer (film) 28 will serve as an oxygen and water barrier that helps protect quantum dots 20 from exposure to oxygen and water. If desired, light scattering material such as metal oxide particles may be incorporated into the layers of the structure of FIG. 2 (as separate layers, as portions of quantum dot layers 22, and/or as part of diffusion barrier layers 28). Quantum dot films may be deposited onto a light-emitting diode die as a conformal coating to down-convert blue light to red, green, and blue light, or may be deposited on other suitable substrates.

FIGS. 3, 4, 5, 6, and 7 are cross-sectional side views of quantum dot structures during a fabrication process in which packaged quantum dot light sources are being produced.

Figure 3:
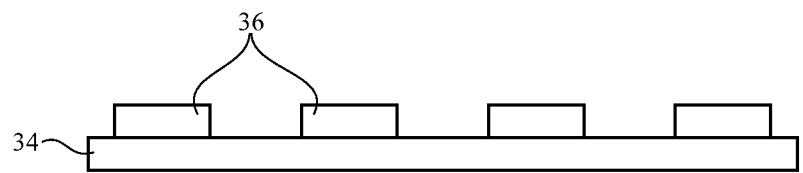
FIGS. 3, 4, 5, 6, and 7 are side views of illustrative light sources with diffusion barrier structures during various phases of fabrication in accordance with an embodiment.

As shown in FIG. 3, light-emitting diodes 36 may be mounted on substrate 34. Substrate 34 may be a flexible polymer carrier tape (e.g., a flexible printed circuit), part of a plastic structure for a package, or any other suitable substrate. Solder joints, conductive adhesive connections, or other mounting structures may be used to mount light-emitting diodes 36 to metal traces on substrate 34. Light-emitting diodes 36 may be blue light emitting diodes or other suitable light-emitting diodes.

Figure 4:
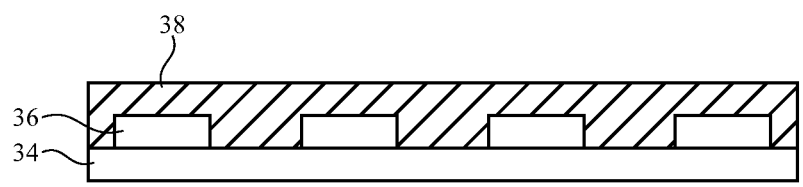
Figure 5:
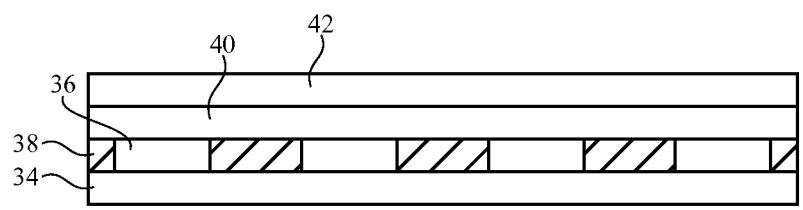

As shown in FIG. 4, a coating such as white reflector coating 38 may be deposited on the upper surface of substrate 34 so that coating 38 covers the tops and sides of light-emitting diodes 36. Coating 38 may be formed from titanium dioxide particles, silica composite particles, other ceramic particles, or other reflective particles. The particles of coating 38 may be suspended within a matrix such as a matrix formed from epoxy, acrylic, silicone, or other polymer materials.

After depositing coating 38, the top portion of coating 38 may be removed (e.g., using polishing, bead blasting, etc.) so that the upper surface of coating 38 lies flush with the upper surfaces of light-emitting diodes 36. Layers 40 and 42 may then be formed on light-emitting diodes 36 and reflective coating 38. Layer 40 may be a quantum dot layer(s). For example, layer 40 may include layers of red and green quantum dots in a matrix such as a silicone matrix or other polymer matrix (see, e.g., layers 22 of FIG. 2). Layer 42 may be a diffusion barrier layer (see, e.g., layers 28 of FIG. 2).

Figure 6:
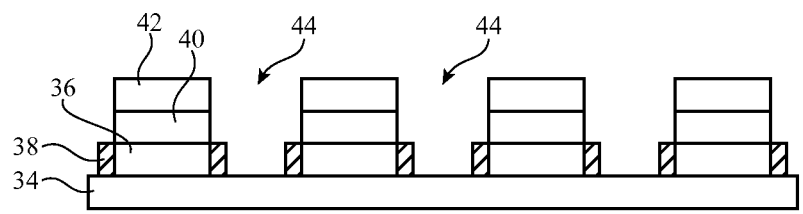

As shown in FIG. 6, channels 44 may be formed between respective light-emitting diodes. Channels 44 may be formed by sawing or other material removal techniques.

Figure 7:
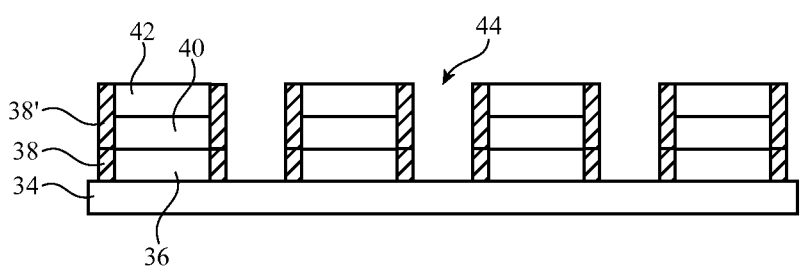

After channels 44 have been formed, additional white reflective coating material 38' may be deposited on the exposed edges of layers 40 and 42 (e.g., material 38' may be deposited by overloading or spray coating followed by bead blasting), as shown in FIG. 7. Material 38' may help laterally confine light emitted from light-emitting diodes 36 (e.g., to enhance the amount of light passing through quantum dots 20). The light-emitting diodes structures of FIG. 7 may serve as backlight light sources, pixels in a pixel array, or other display light sources.

Figure 8:
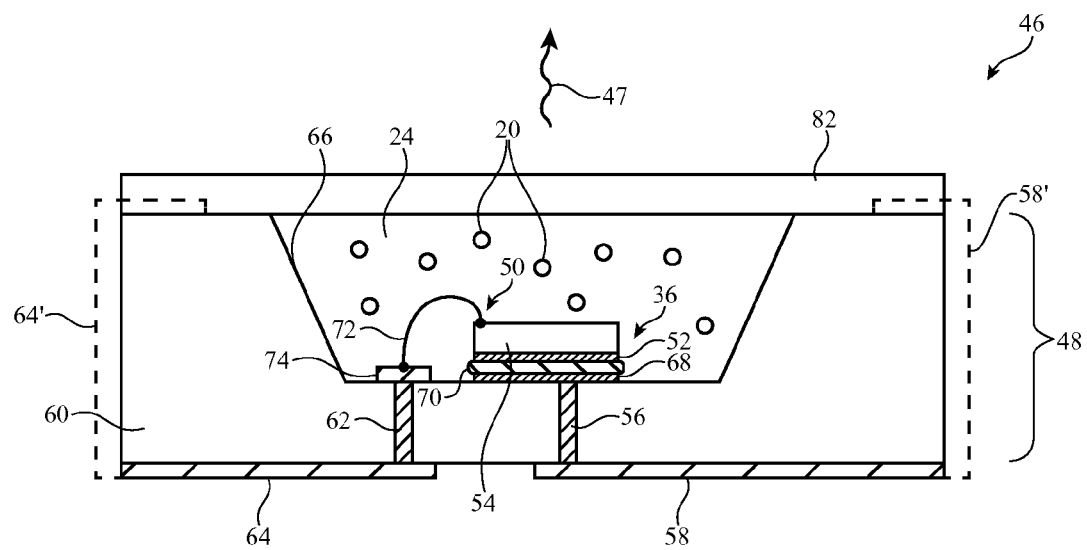
FIG. 8 is a cross-sectional side view of an illustrative wired-bonded packaged light-emitting diode with quantum dots in accordance with an embodiment.
Figure 9:
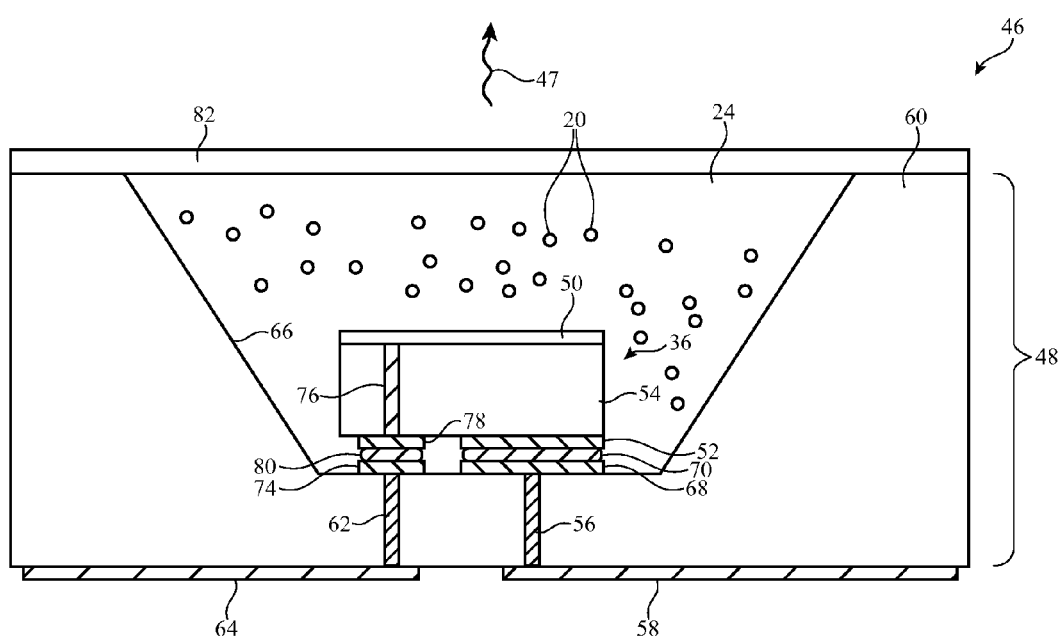
FIG. 9 is a cross-sectional side view of an illustrative light-emitting diode with quantum dots that has been packaged in a chip scale package in accordance with an embodiment.
Figure 10:
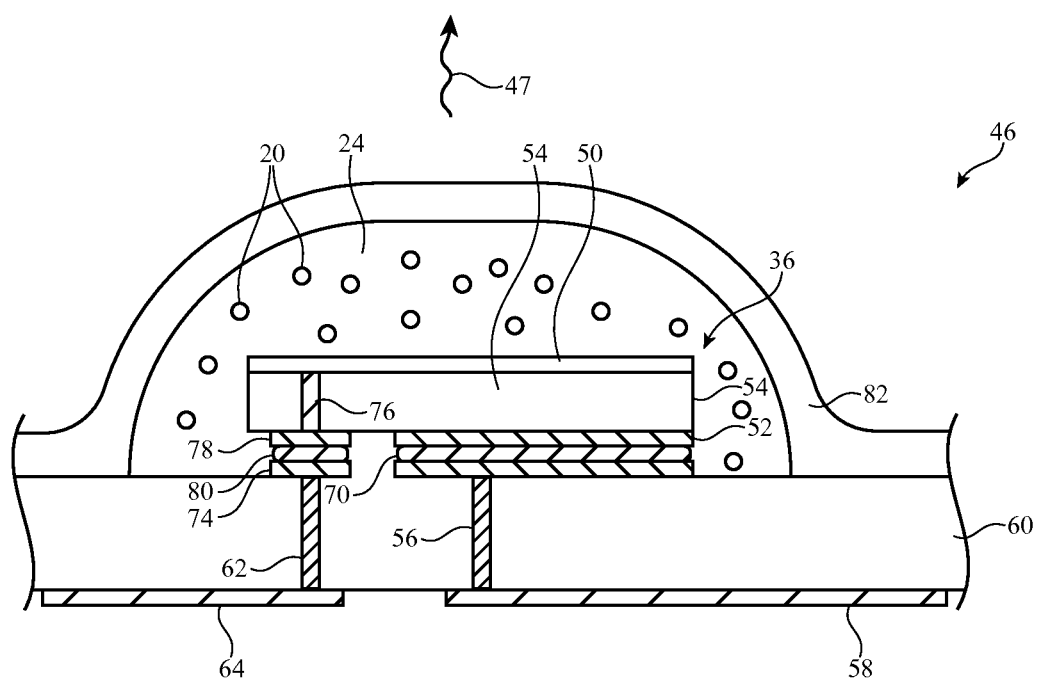
FIG. 10 is a cross-sectional side view of an illustrative light-emitting diode with quantum dots that has been mounted on the upper surface of a chip scale package in accordance with an embodiment.

FIGS. 8, 9, and 10 show how quantum dots may be incorporated into the same package as a light-emitting diode.

FIG. 8 is a cross-sectional side view of a light source having a light-emitting diode and quantum dots that is based on a wire-bonded package structure. As shown in FIG. 8, light-emitting diode 36 may be mounted in package 48. Light-emitting diode 36 may include semiconductor die 54 and contacts (terminals) such as terminals 50 and 52. Package 48 may be formed from plastic structure 60. Package body 60 may have a recess such as recess 66. Recess 66 may have a tapered shape as shown in FIG. 8 or may have other shapes. Inner package contacts 74 and 68 may be formed on the bottom surface of recess 66. Terminal 50 of light-emitting diode 36 may be wire bonded to contact 74 of package 48. Terminal 52 of light-emitting diode 36 may be soldered to contact 68 using solder 70.

Package 48 may have vias such as vias 62 and 56 that extend through package body 60. Via 62 may electrically connect inner package contact 74 to outer package contact (terminal) 64. Portions 64' of contact 64 may, if desired, extend around the sides and/or top surface of package body 60. Via 56 may electrically connect inner package contact 68 to outer package contact (terminal) 58. Portions 58' of contact 58 may extend around the sides and/or top surface of package body 60.

Recess 66 in package body 60 may be filled with quantum dot material. For example, one or more layers of quantum dots 20 may be embedded in matrix 24. Matrix 24 may be a polymer such as silicone or other material that withstands extended exposure to light and heat. Quantum dots 20 may include red quantum dots and green quantum dots and/or quantum dots of other colors (e.g., yellow quantum dots). Light-emitting diode 36 may emit blue light. Some of the blue light is transmitted through the quantum dot material and is emitted as a blue portion of emitted light 47. Other blue light from light-emitting diode 36 is absorbed by the quantum dots and reemitted by the quantum dots as red, green, and/or yellow light components in emitted light 46.

To protect quantum dots 20 from oxygen and water, package 48 may be covered with a protective layer such as layer 82. Layer 82 may be a diffusion barrier coating such as film 28 of FIG. 2 or other protective layer. Layer 82 may be deposited onto the silicone or other matrix material (material 24) into which quantum dots 20 have been embedded. Layer 82 may be deposited from a solution, may be deposited using sputtering or other physical vapor deposition techniques, may be deposited using atomic layer deposition, may be deposited using chemical vapor deposition, may be blade coated, screen printed, dripped, sprayed, pad printed, ink-jet printed, spin-coated, or deposited using other suitable deposition techniques. The thickness of layer 82 may, if desired, be less than 10 microns, less than 20 microns, more than 1 micron, 5-15 microns, or other suitable thickness. The thermal coefficient of expansion of layer 82 may, if desired, be close to or equal to the thermal coefficient of expansion of matrix material 24 (e.g., silicone) to prevent cracking during heating of material 24 during use of light source 24. Illustrative materials that may be used in forming layer 82 include polymer films such as polyimide, aminosilane, sol-gel materials such as sol-gel metal oxides that are deposited as a liquid and solidified by dehydration, spin-on glass, sputtered metal oxides such as aluminum oxide or other metal oxides, metal oxides applied by atomic layer deposition or other deposition techniques, plate-shaped particles such as particles 32 of FIG. 2, or other materials for forming a protective layer over quantum dots 20 and the other structures of light source 46. Layer 82 may be deposited as a coating (e.g., a conformal coating) or may be a film that is attached to the upper surface of light-source 46. If desired, layer 82 may be impregnated with quantum dots (e.g., red, green, or yellow dots) or may be impregnated with phosphors. Light diffusing material such as metal oxide particles may also be incorporated into layer 82).

In the illustrative arrangement for light source 46 of FIG. 9, via 76 passes through semiconductor die 54 of light-emitting diode 36. Light-emitting diode contact 78 is connected to via 76 and is attached to inner package contact 74 of package 48 using solder 80. Contact (terminal) 52 of light-emitting diode 36 may be coupled to inner package contact 68 of package 48 by solder 70.

Vias 62 and 56 may extend through body 60 of package 48 and may connect contacts 74 and 68 to respective outer contacts such as contacts 64 and 58. Contacts 64 and 58 may, if desired, extend to the sides and front of package 48. Quantum dots 20 in polymer matrix 24 may fill recess 66. During operation, light from light-emitting diode 36 may excite quantum dots 20. Light 47 may be emitted outwards from recess 66 from light-emitting diode 36 and dots 20. As with light source 46 of FIG. 8, light source 46 of FIG. 9 may be covered with protective layer 82 (i.e., protective layer 82 may form a coating that covers matrix material 24 and quantum dots 20).

In the illustrative arrangement for light source 46 of FIG. 10, light-emitting diode 36 is covered with quantum dot material that is enclosed within encapsulant 82. In light-emitting diode 36, via 76 passes through semiconductor die 54. Light-emitting diode contact 78 is connected to via 76 and is attached to upper surface package contact 74 of package 48 using solder 80. Contact (terminal) 52 of light-emitting diode 36 may be coupled to inner package contact 68 of package 48 by solder 70.

Vias 62 and 56 may extend through body 60 of package 48 and may connect contacts 74 and 68 to respective outer contacts such as contacts 64 and 58. Contacts 64 and 58 may, if desired, extend to the sides and front of package 48. If desired, vias 62 and 56 may be omitted (e.g., in a configuration in which front-side contacts extend outwardly from under light-emitting diode 36). Quantum dots 20 in polymer matrix 24 may cover light-emitting diode 36. Protective layer 82 (e.g., a conformal coating, a film, or other protect layer such as layers 82 of FIGS. 8 and 9) may be used to cover and protect matrix material 24 and quantum dots 20.

Figure 11:
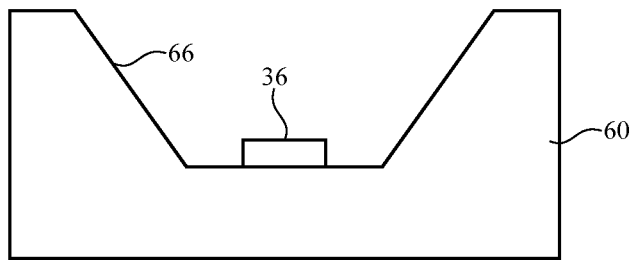
FIGS. 11, 12, 13, and 14 are cross-sectional side views of an illustrative light source with diffusion barrier structures during various phases of fabrication in accordance with an embodiment.
Figure 12:
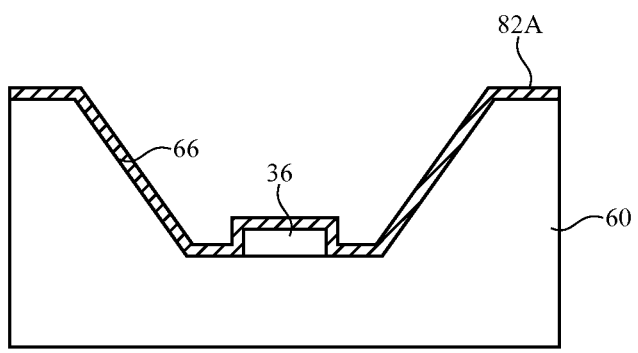

If desired, the material of protective layer 82 may be extended under and around the sides of matrix material 24 and quantum dots 20 to form an encapsulation structure that encloses and surrounds material 24 and quantum dots 20. An illustrative technique for forming this type of encapsulation for light source 46 is shown in FIGS. 11, 12, 13, and 14. As shown in FIG. 11, light-emitting diode 36 may be soldered or otherwise mounted in recess 66 of package body 60. As shown in FIG. 12, following mounting of light-emitting diode 36 in package body 60, a first portion of protective (diffusion barrier) layer 82 may be deposited such as layer 82A. Layer 82 may be formed from plate-shaped particles in a polymer matrix or other suitable diffusion barrier materials.

Figure 13:
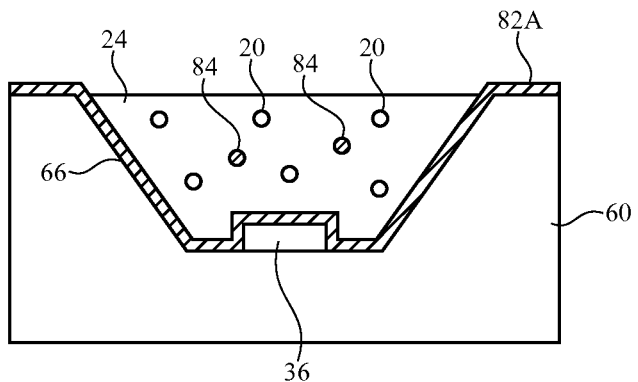
Figure 14:
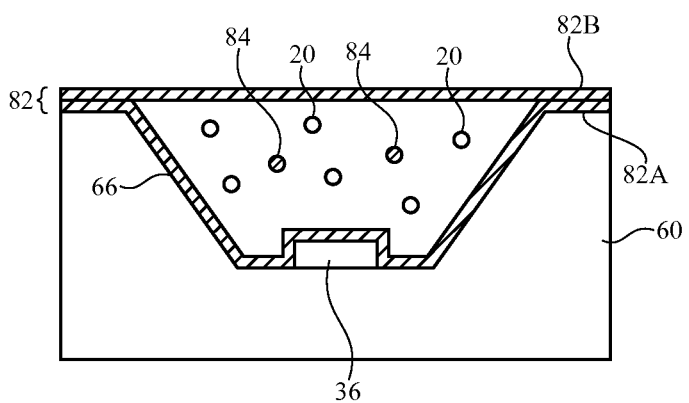

After forming layer 82A, one or more layers of quantum dots 20 in polymer matrix material 24 and/or other layers of material (e.g., light-scattering layers, spacer layers, etc.) may be deposited over light-emitting diode 36, as shown in FIG. 13. If desired, optional particles 84 may be included in matrix 24 (e.g., in one or more of the layers of material covering light-emitting diode 36). Particles 84 may be, for example, a getter that getters oxygen and/or water. In the illustrative package configuration of FIG. 13, quantum dots 20 and matrix material 24 fill recess 66. In other types of package (e.g., packages of the type shown in FIG. 10), matrix material 24 may cover light-emitting diode 36 on the upper surface of package body 60. As shown in FIG. 14, after quantum dots 20 in matrix material 24 have been formed over light-emitting diode 36, a second portion of protective layer 82 such as layer 82B may be deposited. Layers 82A and 82B may be formed from a transparent material that serves as a diffusion barrier to oxygen and water (see, e.g., layer 82 of FIGS. 8, 9, and 10). Because layers 82A and 82B surround the top, bottom, and sides of material 24, material 24 and quantum dots 20 in material 24 may be protected from oxygen and moisture.

In configurations in which particles 84 include a getter, the getter may be an oxygen and/or water getter and may be implemented in particle or molecular form. The getter may be incorporated into quantum dot matrix material 24, layer 82, or other structures supporting dots 20 to absorb and/or react with oxygen and/or water. This helps prevent the oxygen and water from interacting with quantum dots 20 and lowering quantum dot lifetime.

The getter may be a water getter such as STAYDRY™ getter material from Cookson Electronics, zeolites, other mineral-type compounds that are good water absorbers (e.g., microporous particles formed from aluminosilicate minerals such as $Na_2Al_2Si_3O_{10} \cdot 2H_2O$), bentonite clay (a calcium rich montmorillonite layered structure that attracts and binds water molecules to its inner and outer surface area), moisture adsorbent silica gel (made of highly porous amorphous silicon oxide, which binds water molecules in random intersection channels of various diameters), calcium sulfate, and calcium chloride. If desired, the getter may be an oxygen getter such as SAES Getters St101 or St777P, pyrogallol (a molecular oxygen getter), Ca metal (an oxygen scavenger), mannitol (an oxygen scavenger), sodium azide (an oxygen scavenger), catechol (also known as pyrocatechol or 1, 2 dihydrobenzene, which is an oxygen scavenger), ascorbic acid (an oxygen scavenger), MnTBAP also known as manganese(III)-tetrakis(4-benzoic acid) porphyrin (an oxygen scavenger), hydrazine, a protocatechuic acid/protocatechuate-3,4-dioxygenase system, zirconium-aluminum-iron alloys, zirconium-aluminum alloys such as Zr—Al—Fe or other alloys from the IV-A Group (Ti, Zr, Th) of the periodic table of elements (oxygen scavengers that work by chemically binding gaseous molecules to their surfaces and that are activated at relatively low temperatures such as temperatures below 500 C), etc.

The getter may be included with quantum dots 20 in matrix 24, may be included in a film that is located above or below matrix 24 and/or above or below dots 20 (e.g., a film such as layer 82 and/or a layer of material inside of layer 82), may be formed in a ring or other shape that runs along the periphery of quantum dot material 24 and dots 20 (e.g., along a seal formed to enclose material 24 and dots 20 within a protective film such as film 82 and/or a package body such as body 60), and/or may be included in other areas within light source 46 to help prevent materials such as oxygen and/or water from interacting with quantum dots 20.

If desired, particles 84 may include inorganic particles that form an inorganic supporting matrix for quantum dots 20 (e.g., matrix 24 may be formed from inorganic particles in addition to or instead of a polymer). The inorganic matrix particles may be, for example, closely packed semiconductor or metal oxide nanoparticles that help separate quantum dots 20 from direct contact with each other. This helps prevent quantum dots 20 from chemically reacting with each other and helps prevent energy transfer between an excited quantum dot and a neighboring quantum dot (e.g., the separation provided by particles 84 may help avoid undesired nonradiative relaxation of the excited quantum dots). The nanoparticles of the inorganic matrix may be configured to not absorb blue light from light-source 36 and may be formed from materials that are stable in the presence of heat, light, oxygen, and water. Examples of metal oxides that may be used in forming the particles include $ZnO$, $MnO$, $SiO_2$, $TiO_2$, $Al_2O_3$, $MgO$, $CaO$, $WO_3$, $V_2O_5$, $Ta_2O_5$, $La_2O_3$, $BeO$, $CeO_2$, $ZrO_2$, and $SrO$. The nanoparticles may be of the same size as quantum dots 20 or may be similar in size to quantum dots 20 to help avoid phase separation and aggregation (e.g., to help ensure that the mixture of dots 20 and nanoparticles in the supporting matrix remains homogeneous).

If desired, the surfaces of the inorganic matrix particles that are supporting dots 20 (and, if desired, dots 20) may be coated with an organic or inorganic ligands (e.g., ultra small ligands such as inorganic ligands, small chain or aromatic carboxylates, amines, phosphoric acids, etc.) so that the particles may closely pack in an ultra dense manner. Coating the surfaces of the nanoparticles with organic or inorganic ligands may help allow the particles to be dispensable in a solvent such as alcohol. During formation of the mixed quantum dot and nanoparticle layer, heating may be used to drive out solvent and cause the nanoparticle matrix to densify around quantum dots 20. The nanoparticle matrix may be used to fill a cavity in light source 46 (see, e.g., recess 66) or may be used to form microparticles that could then be coated with metal oxides (e.g., using atomic layer deposition or other coating techniques) and/or water barrier or oxygen barrier polymers to provide further stabilization. The coating may, for example, form a barrier to both oxygen and water. Coated microparticles may each contain multiple quantum dots and multiple matrix particles. Coated microparticles may be dispensed into a polymer (e.g., silicone) and placed on or inside package body 60. If desired, additional protective layers may be used to protect the microparticles (e.g., diffusion barrier layers, metal oxides, polymer films, etc.).

Figure 15:
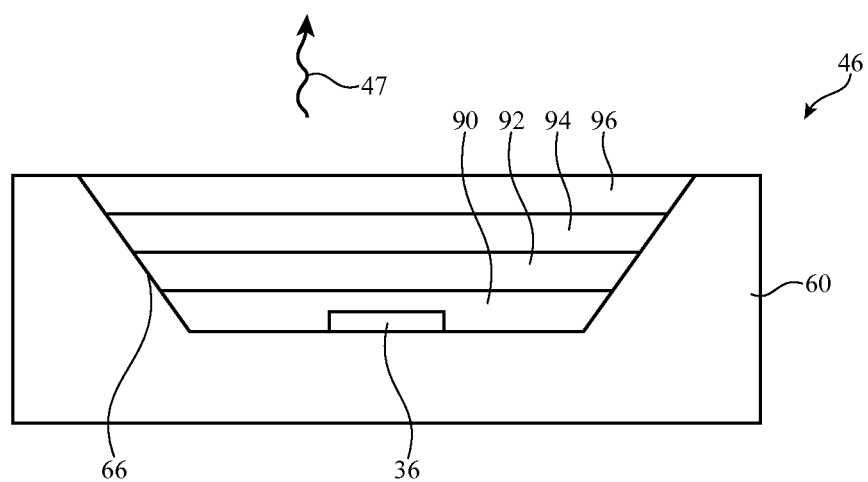
FIG. 15 is a cross-sectional side view of an illustrative light source having a light-emitting diode packaged under layers of quantum dots in accordance with an embodiment.

FIG. 15 shows how light source 46 may be provided with multiple layers of material over light-emitting diode 36. In the example of FIG. 14, light source 46 includes four layers (layers 90, 92, 94, and 96). If desired, light source 46 may have only a single layer, may have two or more layers, may have three layers, may have five or more layers, or may have any other suitable number of layers. These layers may be formed within recess 66 of package body 60 or may be used to cover light-emitting diode 36 in other types of package configurations. The layers of light source 46 such as layers 90, 92, 94, and 96 may include light diffusion layers, quantum dot layers, phosphor layers, diffusion barrier layers, layers with getter material, other suitable layers, and/or combinations of any two or more or three or more of these types of structures.

Examples of particles that can help scatter light and that may therefore be incorporated into a light diffusion layer include metal oxides (e.g., titanium dioxide particles, barium oxide, etc.). These particles may be embedded in a matrix such as a silicone matrix or a matrix formed from other polymer materials. Quantum dots of different colors may be mixed together and/or quantum dots of different colors may be provided in different layers.

If desired, a light scattering layer (e.g., a layer of light scattering particles such as metal oxide particles) may be formed as the first layer (layer 90) of light source 46. A second layer (e.g., layer 92) may be a red quantum dot layer. A third layer (e.g., layer 94) may be a green quantum dot layer. The excitation density (number of turn-over events) for the quantum dots and the temperature of the quantum dots may be reduced with this type of arrangement (i.e., by interposing a light scattering layer between light-emitting diode 36 and the quantum dots). By spreading out excitation of the quantum dots more uniformly, excitation hot spots may be reduced and more uniform color output as a function of angle may be achieved.

If desired, an additional color of quantum dots (e.g., yellow quantum dots) may be included in one or more of the layers of light source 46 (e.g., the same layer that contains the red and green quantum dots, a yellow layer that is interposed between red and green layers, etc.).

To provide a desired thermal characteristic, the silicone resin of one or more of the layers (e.g., matrix 24) may be modified by adding inorganic microparticles or nanoparticles. The additional particles may be incorporated into any of the layers of light source 46 (e.g., layers above the quantum dot layers, etc.). The layer into which the particles have been incorporated may be transparent, may be highly scattering, or may have other optical properties. The incorporation of the additional particles may modify the thermal characteristics of light source 46. For example, the matrix that has been filled with the additional particles may be highly thermally conductive or may exhibit thermally insulating properties (e.g., above the quantum dot layers and away from light-emitting diode 36). In a multi-layer light source, a first of the layers (e.g., layer 90) may be a light scattering layer that includes particles that provide high thermal conductivity. If desired, layer 90 may include a microporous or nonporous material, with the pores providing insulating and/or light-scattering properties. Thermal control layers may, if desired, be incorporated higher in the stack of layers of source 46 (see, e.g., layers 92, 94, and 96).

A layer in light source 46 such as layer 90 may be configured to enhance heat conduction using a resin filler (e.g., matrix 24) with enhanced heat conduction properties. With this type of approach, package body 60 can be thermally bonded to a heat sink to improve heat conduction away from the device.

Red quantum dots may be more stable than green quantum dots. Accordingly, a red quantum dot layer may be placed lower in the stack of layers on package 60 than a green layer. The lowest layer (layer 90) may be a red layer and the next layer up (layer 92) may be a green layer. Alternatively, layer 90 may be a light scattering layer, layer 92 may be a red quantum dot layer, and layer 94 may be a green quantum dot layer. If desired, one or more layers may be interposed between the green and red layers (e.g., a yellow quantum dot layer, one or more light scattering layers, a getter layer, a diffusion barrier layer, etc.). As an example, layer 90 may be a light scattering layer, layer 92 may be a red quantum dot layer, layer 94 may be a yellow quantum dot layer, and layer 96 may be a green quantum dot layer. The topmost layer and, if desired, the lowermost layer may be a diffusion barrier layer (e.g., a diffusion barrier layer with plate-shaped particles in a polymer matrix) and/or other diffusion barrier layers may be included.

When green quantum dots are located in a layer above the red quantum dots (i.e., when the less stable quantum dots are located farther away from light-emitting diode 36 than the more stable quantum dots), light source lifetime and efficiency may be enhanced. In particular, because the less stable green quantum dots are farther away from the light source than the red quantum dots, the green quantum dots will have a lower turnover rate. Excitation of the green emitting quantum dots will also be spread out more uniformly, reducing excitation hot spots and providing more uniform color over angle.

If desired, a spacer layer may be incorporated into the layers above light-emitting diode 36. For example, layer 90 may be a transparent spacer layer (e.g., layer of silicone or other polymer) that adds more distance between light-emitting diode 36 and the quantum dots or layer 90 may be a scattering layer and layer 92 may be a spacer layer.

Phosphors (e.g., YAG phosphors or other phosphors) may exhibit enhanced stability relative to quantum dots. Accordingly, a stable green phosphor in silicone or another polymer may be used in forming layer 90. This layer will scatter blue light creating more uniform excitation for red quantum dots in layer 92. If desired, a yellow quantum dot layer may be interposed between the green phosphor layer and the red phosphor layer. Scattering layers, spacer layers, and other layers may also be incorporated into a layer stack that includes quantum dot layers and/or phosphor layers interspersed with optional diffusion barrier layers, getter layers, thermally conductive layers (heat transport layers) and/or the particles used in forming one or more of these layers may be combined into a single layer. If desired, layer 90 may be a red phosphor layer in which red phosphors are embedded in silicone or another polymer. Layer 92 may be a green quantum dot or green phosphor layer. A layer of yellow quantum dots or phosphors may be interposed between the red and green layers and/or other layers of material may be incorporated into light source 46.

Quantum dots 20 may be formed from nested layers of semiconductors. Variables such as the number of semiconductor layers used, the types of semiconductor compounds used, lattice mismatch, stability, carrier confinement, and size can influence quantum efficiency. Ease of manufacturing and use of nontoxic materials are generally desirable. Balancing these considerations to produce quantum dots that perform optimally can be challenging.

With one suitable arrangement, dopant is added to one or more semiconductor quantum dot layers. The dopant will shift the conduction and valence bands in the semiconductor quantum dot layers. These energy band shifts can be exploited to design enhanced quantum dots (e.g., carrier confinement can be enhanced by deepening the energy wells formed within the quantum dots).

Figure 16:
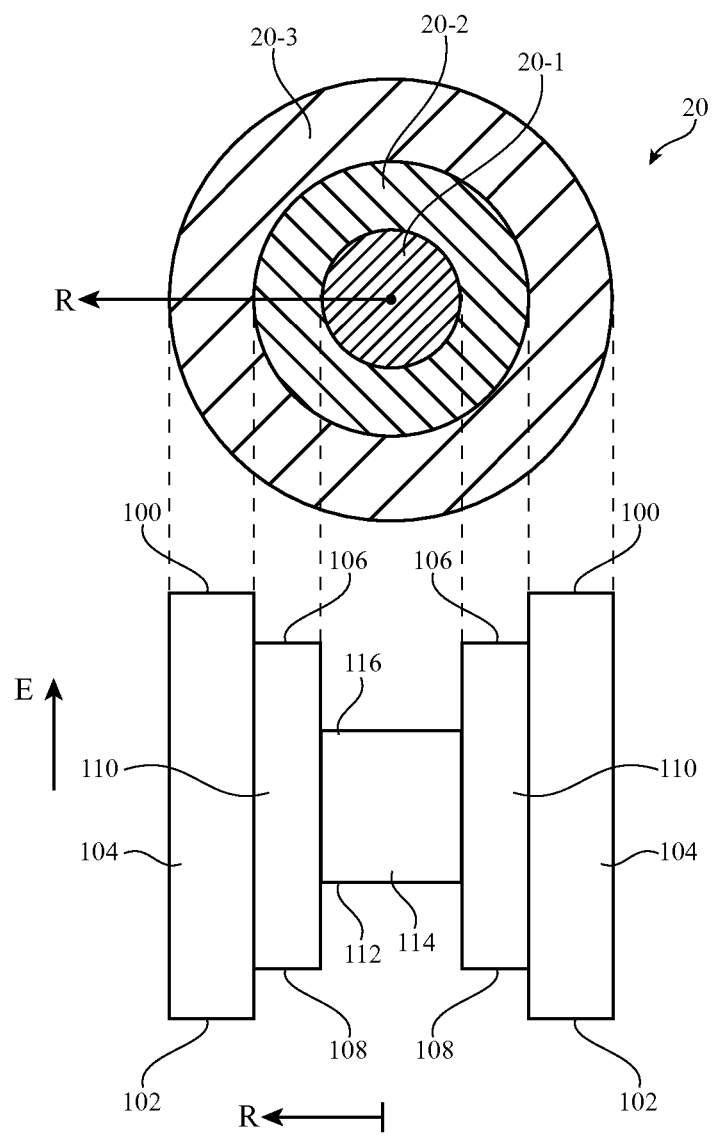
FIG. 16 is a diagram containing a cross-section of an illustrative quantum dot and a corresponding energy band diagram in accordance with an embodiment.

Consider, as an example, quantum dot 20 of FIG. 16. As shown in FIG. 16, quantum dot 20 may have multiple layers of semiconductor such as inner (core) layer 20-1 and outer layers such as intermediate layer 20-2, and outermost layer 20-3. The core of dot 20 is spherical. The layers surrounding the core are hollow spheres and are therefore sometimes referred to as shells. There are three layers of semiconductor in the example of FIG. 16, but quantum dots 20 may, if desired, have two layers, three or more layers, four layers, etc.

As shown in the energy band diagram in the lower portion of FIG. 16, each semiconductor layer in quantum dot 20 has a different respective set of conduction and valence bands. For example, layer 20-1 is characterized by valence band 112 and conduction band 116 separated by bandgap 114, layer 20-2 is characterized by valance band 108 and conduction band 106 separated by bandgap 110, and layer 20-3 is characterized by valance band 102 and conduction band 100 separated by bandgap 104. To enhance quantum dot performance, one or more of the layers of quantum dots 20 may be doped, thereby shifting the conduction and valance bands so that the Fermi levels of the semiconductor layers are aligned.

The way in which the energy bands of a quantum dot are altered by doping depends on the doping type (n or p), which quantum dot layers have been doped, and the identity of the semiconductor materials used.

Consider, as an example, the quantum dot structure of FIG. 17. The diagram of FIG. 17 shows the conduction band (upper band) and valence band (lower band) energy levels for a quantum dot having a CdSe core, a CdS inner shell, and a ZnS outer shell. FIG. 18 shows how both the conduction band and valance band of the CdSe core may be shifted to lower energy levels (to provide a deeper quantum well in the center of the quantum dot) by incorporation of n-type dopant (i.e., the use of n-type CdSe to form the core results in lower conduction and valance band energies relative to the conduction and valance bands of the CdS inner shell than the undoped CdSe core of FIG. 17). Examples of n-type dopant for the CdSe core include Sn, In, Al, Cl, Br, I, and Ga.

The diagram of FIG. 19 shows how an enhanced quantum well for the quantum dot may be formed by incorporating p-type dopant into the inner CdS shell and the outer ZnS shell. The p-type dopant may be, for example, N, P, As, SbCu, Li, Na, or Ag.

Another illustrative doping scheme for this type of quantum dot semiconductor system is shown in FIGS. 20, 21, and 22. FIG. 20 shows the undoped case—i.e., an undoped CdSe core, an undoped CdS inner shell, and an undoped ZnS outer shell. With the configuration of FIG. 21, the depth of the core well relative to the inner shell has been enhanced by doping the CdS inner shell with p-type dopant (e.g., N, P, As, Sb, Cu, Li, Na, or Ag). With the illustrative configuration of FIG. 22, the inner shell has been doped n-type (e.g., with Sn, In, Al, Cl, Br, I, or Ga) and the core and outer shell have been left undoped as in the configuration of FIG. 21.

FIGS. 23, 24, 25, 26, 27, 28, and 29 illustrate how quantum dots 20 may be formed using an InP (cadmium-free) system.

Figures 23, 24:
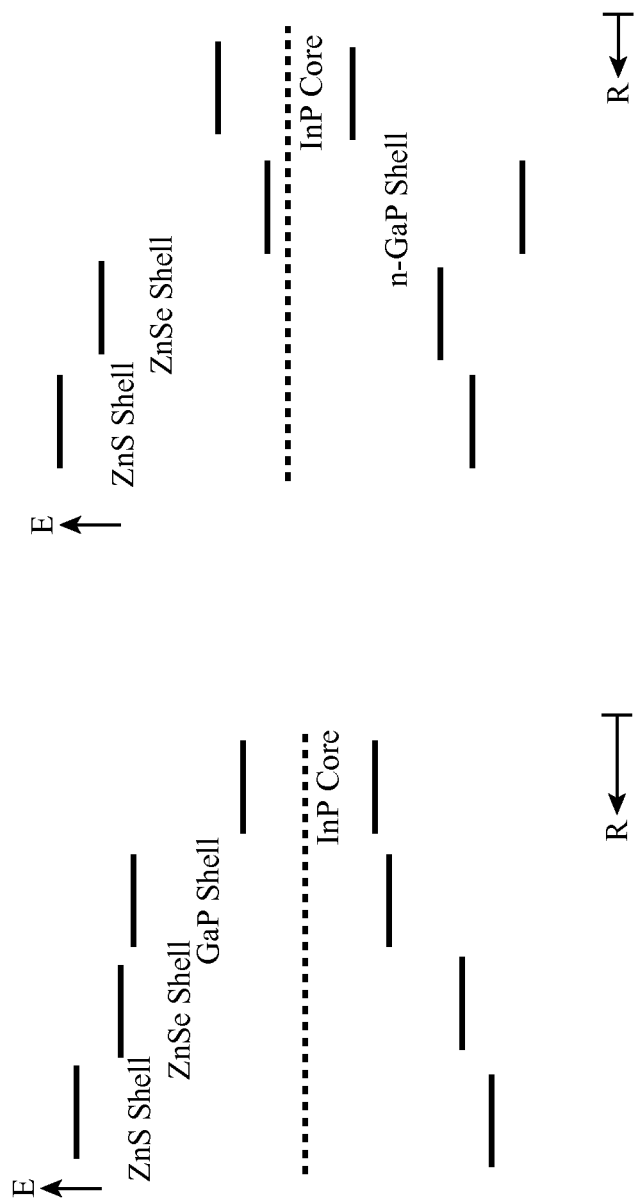

The configurations of FIGS. 23 and 24 are four layer configurations. The undoped case is shown in FIG. 23. The quantum dot core is formed from InP, the first shell is formed from GaP, the second shell is formed from ZnSe, and the third shell is formed from ZnS. Quantum dot performance can be enhanced by doping the GaP shell with n-type dopant (e.g., Te, Si, S, or Se), as shown in FIG. 24.

The configurations of FIGS. 25 and 26 are three layer configurations. The undoped case is shown in FIG. 25. The core is formed from InP, the inner shell is formed from GaP, and the outer shell is formed from ZnS. The example of FIG. 26 shows how the conduction and valance bands in the InP core may shift when doped with p-type dopant (e.g. Zn, Mg, N, Si, Ga, or Be).

The configurations of FIGS. 27, 28, and 29 correspond to InP core systems with three layers and ZnSe inner shells. FIG. 27 is the undoped case. The core is formed from InP, the inner shell is formed from ZnSe, and the outer shell is formed from ZnS. FIG. 28 shows how the bands align when the inner shell is doped with n-type dopant (e.g., Sn, In, Al, Cl, Br, I, or Ga). FIG. 29 shows how the bands align when the inner shell is doped with p-type dopant (e.g., N, P, As, Sb, Cu, Li, Na, or Ag).

The examples of FIGS. 17, 18, 19, 20, 21, 22, 23, 24, 25, 26, 27, 28, and 29 are merely illustrative. In general, any suitable quantum dot semiconductor layers and dopant types (n-type or p-type) may be used to enhance performance. Quantum dots 20 may have semiconductor cores formed from semiconductors such as CdSe, CdZnSe, CdZnS, CdZnSeS, InP, InZnP, InZnSP, InZnSeP, and InSeP. Shells for these quantum dots may be formed from II-VI semiconductor materials (e.g., CdS, ZnSe, ZnS, etc.) or III-V semiconductor materials (e.g., GaP, AlP, MnS, MnSe, etc.). These materials can be doped to enhance confinement in the doped or undoped cores of the quantum dots.

The foregoing is merely illustrative and various modifications can be made by those skilled in the art without departing from the scope and spirit of the described embodiments. The foregoing embodiments may be implemented individually or in any combination.

What is claimed is:
1. A packaged light-emitting diode, comprising:
 a package body;
 a light-emitting diode mounted to the package body; and
 a plurality of layers on the package body and light-emitting diode, wherein the layers include at least one quantum dot layer, wherein the at least one quantum dot layer has microparticles, wherein each microparticle includes metal oxide nanoparticles and quantum dot nanoparticles surrounded by a coating, wherein the microparticles of the at least one quantum dot layer are formed in a polymer matrix, and wherein the polymer matrix also includes at least some getter that getters a material selected from the group consisting of oxygen and water.

2. The packaged light-emitting diode defined in claim 1 wherein the getter comprises a molecular getter.

3. The packaged light-emitting diode defined in claim 1 wherein the getter comprises a particulate getter.

4. The packaged light-emitting diode defined in claim 1 wherein the getter comprises an oxygen getter.

5. The packaged light-emitting diode defined in claim 1 wherein the getter comprises a water getter.

6. The packaged light-emitting diode defined in claim 1 wherein the layers include a light-scattering layer interposed between the quantum dot layer and the light-emitting diode and wherein the light-scattering layer includes metal oxide particles.

7. The packaged light-emitting diode defined in claim 1 wherein the layers include a spacer layer formed from transparent polymer and wherein the spacer layer is interposed between the quantum dot layer and the light-emitting diode.

8. The packaged light-emitting diode defined in claim 1 wherein the quantum dot layer includes thermally conductive particles to enhance the thermal conductivity of the quantum dot layer.

9. The packaged light-emitting diode defined in claim 1 wherein the quantum dot layer is a green quantum dot layer and wherein the layers include a red quantum dot layer and wherein the layers include a yellow quantum dot layer interposed between the red and green quantum dot layers.

10. The packaged light-emitting diode defined in claim 9 further comprising a light-scattering layer having metal particles in a polymer, wherein the light-scattering layer is interposed between the light-emitting diode and the red quantum dot layer.

11. The packaged light-emitting diode defined in claim 1 wherein the layers include a diffusion barrier layer.

12. A packaged light-emitting diode, comprising:
a package body;
a light-emitting diode mounted to the package body; and
a plurality of layers on the package body and light-emitting diode, wherein the layers include at least one quantum dot layer and at least some getter that getters a material selected from the group consisting of oxygen and water, wherein the layers include a diffusion barrier layer, and wherein the diffusion barrier layer comprises plate-shaped particles in a polymer.

13. A packaged light-emitting diode, comprising:
a package body;
a light-emitting diode mounted to the package body;
a plurality of layers on the package body and light-emitting diode, wherein the layers include at least one quantum dot layer and at least some getter that getters a material selected from the group consisting of oxygen and water, wherein the package body has a recess, and wherein a diffusion barrier layer is formed in the recess over the light-emitting diode and under the quantum dot layer; and
an additional diffusion barrier layer that covers the quantum dot layer and that contacts the diffusion barrier layer in the recess, wherein the quantum dot layer is interposed between the diffusion barrier layer and the additional diffusion barrier layer.

14. The packaged light-emitting diode defined in claim 1 wherein the layers include a layer of plate-shaped particles in polymer that serves as a diffusion barrier for the quantum dot layer.

15. The packaged light-emitting diode defined in claim 1 wherein the quantum dot layer comprises quantum dots each of which has a semiconductor core and at least one semiconductor shell surrounding the semiconductor core and wherein a selected one of the semiconductor core and the at least one semiconductor shell includes dopant.

16. The packaged light-emitting diode defined in claim 12, wherein the plate-shaped particles comprise a material selected from the group consisting of: alumina, clay, and mica.

17. The packaged light-emitting diode defined in claim 16, wherein the plate-shaped particles have a diameter and a thickness, and wherein the diameter is between 100 and 10,000 times greater than the thickness.

18. The packaged light-emitting diode defined in claim 17, wherein the thickness is less than 200 nanometers.

19. The packaged light-emitting diode defined in claim 12, wherein the plate-shaped particles are embedded in the polymer.

20. The packaged light-emitting diode defined in claim 19, wherein the polymer comprises silicone.

* * * * *